United States Patent [19]
Alex

[11] Patent Number: 5,616,218
[45] Date of Patent: Apr. 1, 1997

[54] MODIFICATION AND SELECTION OF THE MAGNETIC PROPERTIES OF MAGNETIC RECORDING MEDIA THROUGH SELECTIVE CONTROL OF THE CRYSTAL TEXTURE OF THE RECORDING LAYER

[75] Inventor: Michael Alex, Milpitas, Calif.

[73] Assignees: Matereials Research Corporation, Orangeburg, N.Y.; Sony Corporation, Tokyo, Japan

[21] Appl. No.: 304,561

[22] Filed: Sep. 12, 1994

[51] Int. Cl.$^6$ .................................................. C23C 14/34
[52] U.S. Cl. .................................. 204/192.15; 204/192.2
[58] Field of Search ...................... 204/192.15, 192.16, 204/192.2, 192.12

[56] References Cited

U.S. PATENT DOCUMENTS

| | | | |
|---|---|---|---|
| 4,767,516 | 8/1988 | Nakatsuka et al. | 204/192.2 X |
| 4,776,938 | 10/1988 | Abe et al. | 204/192.2 X |
| 4,816,127 | 3/1989 | Eltoukhy | 204/192.2 X |
| 5,057,200 | 10/1991 | Lal et al. | 204/192.2 X |
| 5,084,152 | 1/1992 | Lin | 204/192.2 X |
| 5,223,108 | 6/1993 | Hurwitt | 204/298.11 X |
| 5,316,631 | 5/1994 | Ando et al. | 204/192.2 |
| 5,330,628 | 7/1994 | Demaray et al. | 204/192.12 |

FOREIGN PATENT DOCUMENTS 202645  11/1986  European Pat. Off. .

OTHER PUBLICATIONS

Komuro Matahiro; others, "Sputtering Device and Production of Magnetic Film" Japanese Abstracts, vol. 18, No. 361, Dated Jul. 7, 1994, Patent No. JP6093439.

*Primary Examiner*—Nam Nguyen
*Attorney, Agent, or Firm*—Wood, Herron & Evans

[57] ABSTRACT

A method for selectively choosing the magnetic properties of a sputter deposited recording layer of a magnetic recording medium comprises sputtering a target of metal underlayer material onto a substrate to deposit an underlayer film and selectively collimating the sputtered underlayer particles to vary the arrival energy and angular distribution of the sputter particles striking the substrate to selectively establish the orientation of the crystals making up the underlayer film. A magnetic metal film is then sputter deposited upon the underlayer film to form a magnetic recording layer, the magnetic metal film having a crystal texture and recording properties affected by the orientation of the crystals in the underlayer film. The magnetic properties of the magnetic recording layer are chosen by selectively collimating while sputter depositing the underlayer material. In an alternative embodiment of the present invention, both the underlayer film and the magnetic metal recording film are selectively collimated when deposited upon the substrate. A still further embodiment of the invention includes selectively collimating only the magnetic metal recording film.

15 Claims, 2 Drawing Sheets

MODIFICATION AND SELECTION OF THE MAGNETIC PROPERTIES OF MAGNETIC RECORDING MEDIA THROUGH SELECTIVE CONTROL OF THE CRYSTAL TEXTURE OF THE RECORDING LAYER

FIELD OF THE INVENTION

This invention relates generally to magnetic recording media and more specifically to a method of modifying the magnetic properties of magnetic recording media through manipulating the crystal texture of the magnetic recording layer during deposition of the layer.

BACKGROUND OF THE INVENTION

The prolific use of computers and other high speed electrical processing equipment has generated an ever-increasing number of applications for magnetic recording media. For example, magnetic recording disks, commonly referred to as hard disks, are used to record and store large amounts of electronic data and are widely utilized throughout the computer industry. Furthermore, other types of magnetic recording media are utilized for similar recording and storage applications.

Magnetic recording media, such as a hard disk, generally comprise a series of film layers deposited upon a substrate base with a magnetizable recording layer positioned as one of the topmost layers. The recording layer is usually a thin polycrystalline film comprising a plurality of metal crystals oriented in a number of different directions. Metal crystals have a defined crystal structure or shape. The individual crystals orient themselves in a particular direction within a metal layer or film to define the crystal texture of the film. The magnetic properties of the film layer, and hence the recording properties of that layer, are dependent upon the crystal texture of the metal film and more specifically upon orientation of the individual crystals with respect to the surface plane of the film.

Polycrystalline cobalt-based alloys are the most common materials used for thin film magnetic recording media. Such cobalt-based alloys include, for example, cobalt nickel chromium (CoNiCr), cobalt platinum chromium (CoPtCr) and cobalt chromium tantalum (CoCrTa), among others, which are sputter deposited onto the substrate. As an illustrative example, an aluminum magnesium (AlMg) base substrate might be plated with a layer of nickel phosphorous (NiP) for hardness and machining purposes. The first thin film layer deposited would then typically be a chromium (Cr) underlayer which determines the crystal texture of the upper layers as described further hereinbelow. Next, the magnetically active cobalt-based recording layer is sputter deposited directly upon the chromium underlayer. A protective overcoat might then be applied over the cobalt-alloy recording layer.

The crystal structure of cobalt is generally that of a hexagonal closed-packed crystal or HCP crystal, as opposed to a body-centered cubic (BCC) or cubic close-packed (CCP) crystal structure. Because of the different atomic arrangements in certain planes and directions within an individual crystal or unit cell, the properties of a crystal cell will vary depending upon the direction or plane along which the property is measured. This is referred to as anisotropy. Cobalt has high crystalline anisotropy, and, as a result, cobalt-alloy recording films have high coercivity and high magnetic remanence which are both desirable properties for magnetic recording media. Coercivity is defined as the measurement of the strength of a reverse magnetic field which is necessary to erase stored data and randomly orient the magnetization of the various crystal structures so that they cancel one another's effects. That is, high coercivity means that a high reverse field must be applied to the recording surface to erase the stored data. Remanence, on the other hand, refers to the resistance offered by the magnetized material which prevents random orientations of the magnetized crystals once the magnetizing field has been removed. That is, it refers to the ability of the film to maintain the stored data once it has been recorded. When the storage media maintains the magnetization in the direction of the original recording field, a residual magnetization (i.e., remanence) is created whereby the material tends to act like a permanent magnet.

Presently, there are two basic types of recording modes. The first type of recording mode is referred to as longitudinal recording and is the basis for most magnetic recording media that is used today. In a longitudinal recording mode, the magnetization of the magnetic storage layer and the magnetization of the crystals in the storage layer, is accomplished in a direction parallel to the surface plane of the sputter deposited thin film recording layer. Therefore, longitudinal recording requires that the magnetic easy axes of the crystals, which are those axes most easily magnetized, be oriented in the film surface plane. This property is termed in-plane anisotropy.

The second recording mode is perpendicular recording. Perpendicular recording holds promise for use in high storage density recording media and is likely to be used more widely in the future. In perpendicular recording, the magnetization is accomplished in a direction normal to the surface plane of the film layer, and therefore, the magnetic easy axes of the crystals making up the storage layer are preferably oriented normal to the film layer surface. This type of orientation is called perpendicular anisotropy and is preferred for perpendicular recording.

Additional crystal orientations also exist in a recording film layer, and the magnetic easy axes of various crystals may be angled slightly with respect to the plane of the film surface between 0° (in-plane anisotropy) and 90° (perpendicular anisotropy). Actual magnetic recording media layers typically have a mixture of both in-plane and perpendicular anisotropy. In the case of longitudinal recording, a perpendicular anisotropy component is useful to suppress media noise, and from the point of noise suppression, it is desirable to "tune" the film anisotropy as necessary to take advantage of the noise reduction properties of the film. Therefore, manipulation of the various orientations of crystals, i.e., manipulation of the crystal texture, in a recording film layer is desirable.

In both longitudinal and perpendicular recording media utilizing sputter deposited cobalt-based alloys, the underlayer film will generally consist of one of chromium (Cr), vanadium (V) and tungsten (W). Cr, V and W have body-centered cubic crystal structures (BCC). Depending upon sputtering conditions such as the deposition pressure and substrate temperature, certain crystal planes of the BCC structure are most commonly found to be parallel to the film surface plane. BCC crystal structures have planes designated by three-digit Miller indices. As an example, in a thin film of BCC chromium, the (200) and (110) designated planes are most commonly found parallel to the film surface plane. After the underlayer is deposited, the cobalt-alloy recording layer is then sputter deposited on top of the underlayer. The underlayer texture is critical because it has been found that the crystal orientation of the underlayer film may be used to select the texture of the recording layer.

More specifically, cobalt and chromium have several interplanar atomic spacing values that are nearly identical, and a particular planar orientation of the crystals in the chromium underlayer establishes a specific planar orientation of the crystals in the upper cobalt-alloy recording layer which is deposited over the underlayer. The texture of the cobalt-alloy layer controls the recording properties of the layer, and thus, it is desirable to control the texture of the underlayer in order to establish the recording layer texture and achieve optimum recording characteristics. In other words, it is desirable to control the growth of the crystals in the sputtered underlayer to achieve a particular texture in the sputtered recording layer depending upon the type of recording for which the recording media is to be used, i.e., longitudinal or perpendicular recording.

The texture of the underlayer has been controlled in the past by varying the sputter deposition temperature, the deposition pressures and/or the thickness of the sputtered layer. For example, elevated deposition temperatures typically promote the growth of a chromium film on a Ni-plated AlMg substrate with the (200) plane parallel the film plane. Lower sputter deposition temperatures usually result in (110) plane chromium films. However, even when the films are deposited using identical sputtering pressures and temperatures, the magnetic properties of the films, when grown on different types of substrates, will vary widely. Furthermore, there is evidence that elevated deposition temperatures, such as those needed to promote the growth of a specific chromium underlayer texture and subsequent magnetic recording layer texture, has negative effects on the quality and mechanical properties of the layers and on the sputtered carbon overcoat that is commonly employed in the industry to protect the magnetic recording film.

Therefore, it is desirable to have a method, and particularly a low temperature deposition method, which may be used to control and modify the texture of the underlayer film in magnetic recording media. Further, it is desirable to control the texture of the magnetic recording layer to achieve the desired magnetic properties of the recording layer.

SUMMARY OF THE INVENTION

The method of the present invention uses selective deposition to achieve a preferred crystal orientation or texture of a sputtered film generally independent of varying deposition temperatures, and particularly, independent of high deposition temperatures. More specifically, collimation is utilized between a sputter target of underlayer material and the recording media substrate to vary the crystal orientation and thus the texture of the sputter deposited underlayer film. The selected texture of the underlayer film determines the texture of the recording film deposited over the underlayer film.

In accordance with the principles of the present invention, a collimator is placed between a sputter target of underlayer material and a recording media substrate. The collimator intercepts sputtered underlayer particles and reduces the sputter deposition rate and varies the arrival energy of the sputtered particles which are deposited at the surface of the substrate. The collimator also manipulates the angular distribution of the sputtered particles which deposit to form the underlayer film. Varying the deposition rate, arrival energy of the particles and angular distribution of the particles affects the crystal texture of the deposited underlayer material. By selectively collimating the sputtered underlayer, one may thereby selectively establish the texture of the underlayer film, and hence, establish the texture and recording properties of the upper magnetic recording layer deposited over the underlayer.

In an alternative embodiment, only the recording layer is sputtered using a collimator and collimation techniques to vary and/or choose the texture of the recording layer. In still another embodiment, both the underlayer and recording layer are sputter deposited with a collimator and collimating techniques.

In order to selectively deposit a film with a desired crystal structure, the aspect ratio of the collimator openings are varied. Furthermore, the distance between the collimator and the target, as well as the distance between the collimator and the substrate are selectively varied in order to establish the desired texture of the sputter deposited films. By promoting and inhibiting certain textures of both the underlayer and the magnetic recording layer of the films, the magnetic properties of a recording film layer may be tailored for a chosen application.

Therefore, the method of the present invention may be used to selectively deposit underlayer and magnetic recording films with desired textures. The process is not temperature dependent and therefore, high temperatures which may damage the underlayer and recording layer and affect the quality of the protective layer are not utilized. The process is used to selectively choose a specific texture for a chosen recording mode such as longitudinal or perpendicular recording. Furthermore, the method may be utilized to promote a film which has a mixture of both in-plane and perpendicular anisotropy to reduce media recording noise.

While the inventive method is particularly useful to deposit cobalt-based recording layers, the method is also useful for promoting uniform magnetic properties in rare/earth transition metal layers commonly used in magneto-optical recording techniques.

BRIEF DESCRIPTION OF THE DRAWINGS

FIG. 4A is a side perspective view of a collimating device with a sputter target and substrate, while

DETAILED DESCRIPTION OF THE INVENTION

Figure 1:
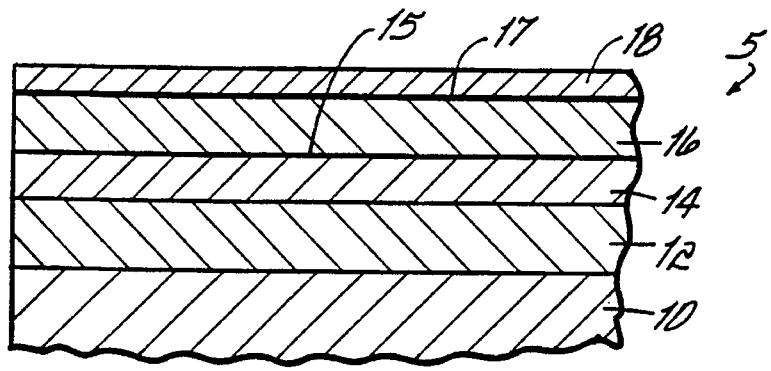
FIG. 1 is a cross-section of a magnetic recording media structure showing various layers.

FIG. 1 shows a cross section of a typical magnetic recording media structure used extensively throughout the computer industry such as in hard storage disks. Structure 5 has a base substrate made of a material such as aluminum magnesium (AlMg), glass, or carbon. As an example in illustrating the invention, the base layer of structure 5 is chosen to be AlMg. On top of the substrate layer 10, a rigid layer 12, such as plated nickel phosphorous (NiP), is deposited to impose a hardness and rigidity to the structure 5 for machining purposes. Next, a polycrystalline metal underlayer 14 is deposited upon the plated NiP layer 12. The underlayer functions to define the texture of the magnetic recording layer 16 as discussed further hereinbelow. On top of underlayer 14, a magnetic recording layer 16 is deposited. A sputtered carbon protective overcoat 18 is applied on top of the recording layer 16. Recording layer 16 is a polycrystalline metal which is magnetized when data is stored on the recording media. For purposes of illustration, the recording layer will be considered to be a cobalt-alloy layer throughout the detailed specification because cobalt-alloys are the predominant material utilized today as recording layer material. However, it should be understood that other magnetic recording materials might be utilized with the method of the present invention to form the recording layer 16.

The underlayer 14 is used to control the orientation of the individual crystal structures making up the magnetic recording layer 16. The underlayer is polycrystalline metal and preferably the metals utilized for the underlayer 14 are metals having body-centered cubic (BCC) crystal structures such as chromium (Cr), vanadium (V) or tungsten (W). Elements having interatomic spacings comparable with those of non-BCC Cobalt would also be useful.

Figure 2A:
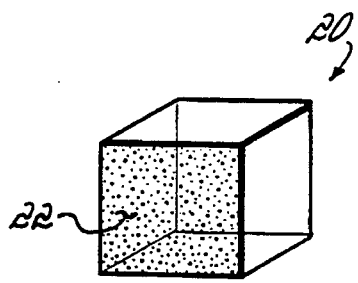
FIGS. 2A and 2B are graphic illustrations of the shape of body-centered cubic (BCC) crystal unit with various crystal planes shaded.
Figure 2B:
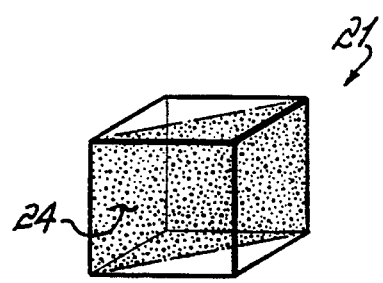

Referring to FIGS. 2A and 2B, graphic representations of individual BCC crystal structures 20, 21 are shown with various shaded planes as depicted by numerals 22 and 24. The planes of a crystal structure 20, 21 are referenced in terms of numerical coordinates in a defined coordinate system, and the properties of the crystal materials, including the magnetic properties, depend upon the plane or direction of the crystal along which the property is measured. The plane coordinates are often designated by Miller indices which are three-digit shorthand notations used to mathematically describe a crystal plane. For example, in FIG. 2A, plane 22 is referred to as the (200) plane in the Miller index system. Alternatively, plane 24, designated by the phantom lines in FIG. 2B, is designated the (110) plane 24. In a sputter deposited BCC chromium underlayer, the crystal planes which are most commonly found parallel to the film surface plane are the (200) and (110) planes shown in FIGS. 2A and 2B, respectively. The crystal planes of the chromium layer parallel to the film surface are utilized to establish a specific crystal orientation and thus texture of the magnetic storage layer 16.

Figure 3A:
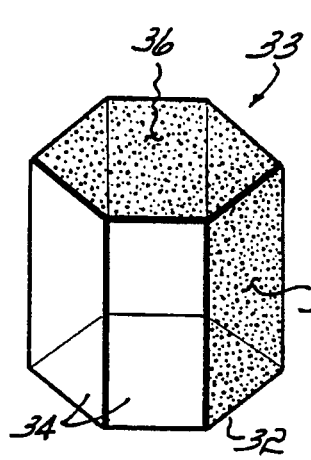
FIGS. 3A, 3B and 3C are graphic illustrations of the shape of a hexagonal close-packed (HCP) crystal unit with various crystal planes shaded.
Figure 3B:
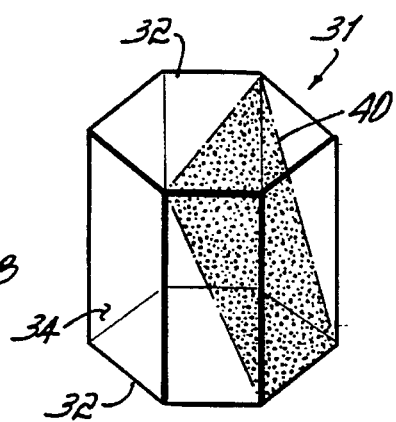
Figure 3C:
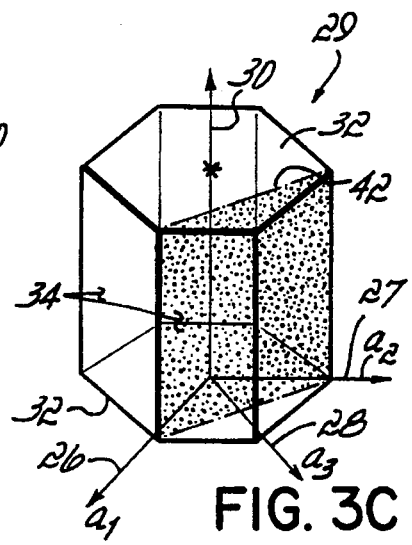

Cobalt-alloys are used to form the magnetic recording layer 16. Referring to FIGS. 3A, 3B and 3C, individual crystal structures of cobalt (Co) 29, 31 and 33, respectively, are shown which are hexagonal close-packed (HCP) structures. The HCP crystal structure such as crystal structure 29 has six, generally identical side planes, such as side planes 34, and two end planes, such as end plane 32 of FIG. 3A. The planes of an HCP crystal structure are defined by Miller-Bravais indices with four coordinate numbers much the same way that Miller indices are used to designate BCC crystal planes. The coordinate system comprises four reference directions along lines $26(a_1)$, $27(a_2)$ and $28(a_3)$ and 30 (c-axis). The magnetic easy axis of the cobalt HCP crystal structure, that is, the axis of the crystal most easily magnetized, is parallel to the c-axis 30.

The crystal plane designated by numeral 36 and set off by phantom lines on structure 29 has a Miller-Bravais designation of (0002). Plane 38 is designated the (0110) plane. Other planes might be defined as shown in FIGS. 3B and 3C. For example, plane 40 of structure 31 is the (0111) plane, while the plane 42 of structure 33 is the (1120) plane.

As discussed above, the most popular type of recording mode currently utilized with magnetic storage media is longitudinal recording. Longitudinal recording magnetizes the crystal structures in the plane of the deposited thin recording film. Since the magnetic easy axes of the various cobalt HCP crystals are in a direction parallel the designated c-axis 30 of the coordinate system, (i.e., in the direction of the (0110) and (1120) planes in crystal structures 29 and 33, respectively), then a magnetic recording film layer 16 to be used for longitudinal recording will require cobalt crystal structures which are oriented have, for example, the (0110) and/or the (1120) planes parallel to the surface plane of the deposited thin film. Films of this texture having their magnetic easy axes oriented in the film surface plane are termed in-plane anisotropic.

The second recording mode, the perpendicular recording mode, is promising as a technique for high storage density recording and requires the magnetic easy axes of the film crystals to be oriented normal to the plane of the film surface. Referring again to FIG. 3A and crystal structure 29, it may be seen that for a cobalt recording layer 16 and perpendicular recording, the (0002) plane, i.e., plane 36, must lie parallel to the surface plane 17 of film layer 16 so that magnetic easy axis 30 and plane 38 lie in a direction perpendicular the surface plane 17. Film layers of this orientation are termed perpendicular anisotropic and are the preferred type of recording layers crystal for perpendicular recording.

Alternatively, if the (0111) plane 40 of structure 31 in FIG. 3B is parallel to the film surface 17 of layer 16, the magnetic easy axis 30 will be angled approximately 28° out of the film plane. Although a recording film layer might be predominantly perpendicular anisotropic, or predominantly in-plane anisotropic, magnetic media will typically have a mixture of both in-plane and perpendicular anisotropy. In the case of longitudinal recording, a perpendicular anisotropy component is particularly useful in suppressing media noise in the magnetic recording layer 16.

The orientations of the crystal structures of the magnetic recording layer 16 may be controlled by the orientations of the crystal structures, i.e., the crystal texture, of the underlayer 14. The present invention manipulates the crystal orientation and texture of underlayer 14 and thus manipulates the crystal texture of the magnetic recording layer 16 to achieve the desired recording characteristics without the drawback of high deposition temperatures.

Figure 4A:
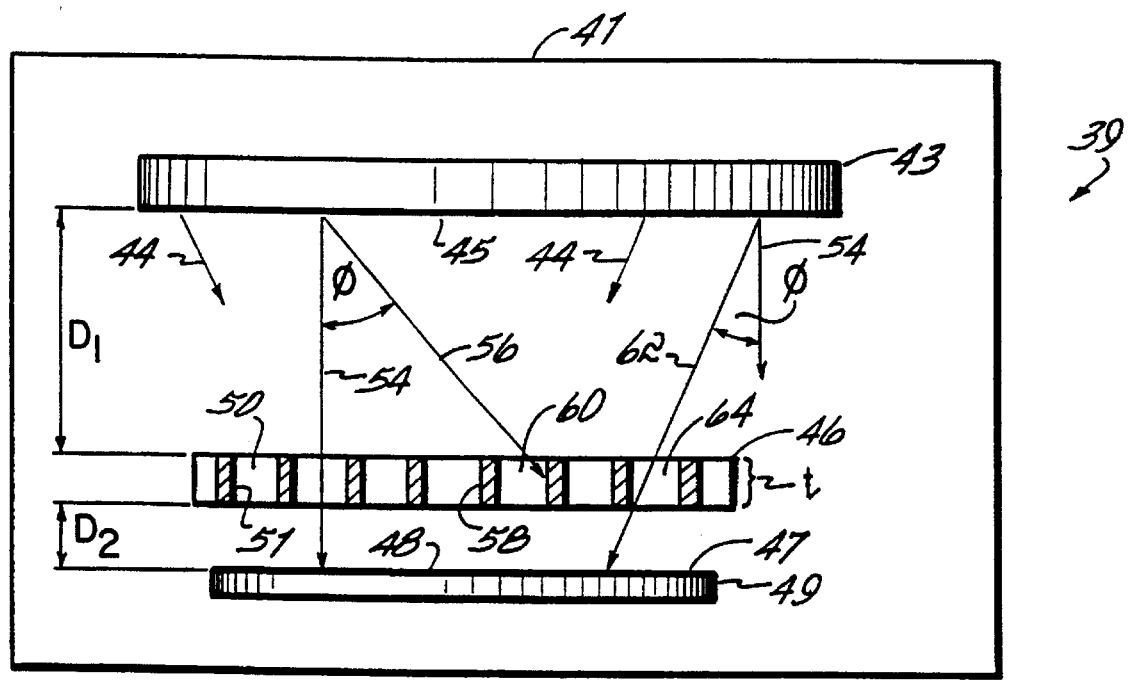

The present invention uses collimation during the sputter deposition of the underlayer film 14 and recording layer film 16 to choose the crystal texture of those layers, and hence, to selectively choose the magnetic recording properties of the recording media. Referring now to FIG. 4A, a sputter deposition system 39 is shown including a collimating device or collimator 46 for collimating and intercepting a portion of the individual particulate materials 44 sputtered from the target 43.

Specifically, a sputter target 43 is situated within a sputter deposition chamber 41 opposite a recording substrate 42 upon which an underlayer is to be deposited. In accordance with well-known sputtering techniques, a gas plasma (not shown) is excited in the presence of target 43 while the target 43 is electrically biased. Ionized plasma particles are attracted to target 43 and bombard the target 43 to dislodge particles of target material 44 which are propelled from the surface 45 of target 43 at various different angular paths with respect to the target surface 45. The particles 44 generally travel toward substrate 42 where they accumulate and physically form deposited film 47 on the surface 48 of the substrate 49. In accordance with the principles of the present invention, collimator 46 is positioned between target 43 and substrate 49 to intercept some of the target particles 44.

Figure 4B:
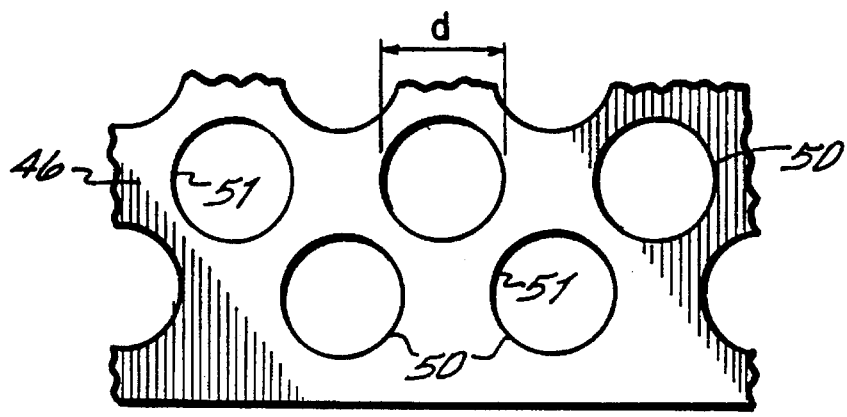
FIG. 4B is a top perspective view of the collimating device of FIG. 4A.

Referring to FIG. 4B, the collimator 46 is generally a plate structure with a plurality of collimating holes or openings 50. The collimating holes 50 have a particular diameter (d) while the collimator 46 has an associated thickness (t) (see FIG. 4A). The ratio of the length of the collimator holes 50 defined by the thickness (t) of collimator 46 to the diameter of the holes (d), (i.e., {t/d}) is defined as the aspect ratio of the collimator 46. The collimator 46 intercepts a portion of the sputter particles 44 which strike the walls 51 of holes 50. The aspect ratio of the collimator 46 determines which sputter particles 44 are intercepted as a function of the angle of their trajectory away from target surface 45 and toward the collimator 46 and the substrate 42.

For example, a collimator which utilizes holes 50 which have a long length (large t dimension) and a small diameter d has a high aspect ratio (a high t/d). High aspect ratio collimators have holes which block a large percentage of sputter particles 44 having trajectory angles deviating from a direction normal to the collimator 46, i.e., normal to a direction defined by reference line 54. For example, particle 56 has trajectory angle 1 with respect to line 54 and will generally strike the sidewall 58 of a collimator hole 60 and be intercepted. On the other hand, sputter particle 62 has a smaller angle $\phi$ with respect to vertical line 54 and therefore passes through hole 64 to deposit on substrate 49. Accordingly, high aspect ratio collimators will generally pass only those sputter particles 62 which move in the direction close to parallel with line 54 and will intercept the remaining particles. Alternatively, a low aspect ratio collimator with wide and shallow openings allows a larger number of sputter particles to pass having a variety of different trajectory angles from vertical line 54.

The collimator 46 is utilized in the present invention to vary the sputter deposition and control the crystal texture of the sputter deposited film. Collimator 46, when placed between the substrate 49 and a target 43 of underlayer material, reduces the arrival energy and the angular distribution of the sputter deposited underlayer particles 44 which deposit on the surface 48 of substrate 49, in addition to intercepting a portion of the sputtered particles 44. Reducing the arrival energy and the angular distribution of the particles 44 which deposit on substrate 49 to form layer 47 varies the crystal texture of the sputtered film 47. Furthermore, reducing the percentage of sputter particles which deposit also affects the crystal texture of the deposited film 47. Therefore, the collimating technique of the present invention varies the crystal texture of the underlayer 14 (See FIG. 7) deposited upon a recording media substrate and collimation may be used to select a particular underlayer crystal structure. Selecting an underlayer crystal texture then determines the crystal texture and magnetic properties of the magnetic recording layer 16 sputter deposited on top of the underlayer 14 as discussed above.

By selectively varying the aspect ratio of the collimator, i.e., varying the thickness of collimator 46 and diameter of holes 50, the crystal texture of the sputter deposited underlayer film 14 may be selectively chosen because the aspect ratio of the collimator affects the angular distribution and arrival energy of the deposited particles as well as the percentage of particles which make it to the substrate surface to form a film. Furthermore, selectively reducing or increasing the distance $D_1$ between the sputtering target 43 and the collimator 46 also affects the deposition, and therefore, affects the crystal texture of the underlayer film 45 such that a desirable texture might be chosen. Similarly, selectively increasing or decreasing the distance ($D_2$) between collimator 46 and the substrate 48 varies the deposition causing variation of the texture of the film 45. In this way, varying the collimating parameters in accordance with the present invention allows selection of the crystal texture, and thus, selection of desirable recording layer film properties.

Returning to FIG. 1, an example using the collimating technique of the present invention to determine the crystal structure of the recording layer is helpful in understanding the overall inventive process. Once the plated NiP 12 layer has been deposited upon the AlMg substrate 10, the substrate is ready to receive the chromium underlayer 14. As discussed above, since the crystal texture and the magnetic recording properties of the cobalt-alloy recording layer 16 are dependent upon the crystal texture of the chromium underlayer 14, it is desirable to selectively choose the crystal texture of the chromium underlayer. To sputter deposit the underlayer 14, the collimator aspect ratio is selectively chosen to produce a particular, desired crystal texture. Furthermore, the target 43 to collimator 46 spacing $D_1$ and collimator 46 to substrate 49 spacing $D_2$ are selectively chosen to produce the desired crystal texture of the underlayer 14.

As mentioned above, the crystal planes most commonly parallel to the film surface in a sputter deposited BCC chromium film are the (200) and (110) planes. Therefore, for example, the collimating parameters may be chosen to deposit an underlayer film 14 comprising BCC chromium crystals with the (200) plane 22 of FIG. 2A parallel to the surface plane 15 of the underlayer film 14. Cobalt and chromium have several nearly identical interplanar atomic spacing values which cause a crystal texture of a chromium underlayer to promote the sputter deposition of a cobalt recording layer with a particular crystal texture. For example, X-ray and electron diffraction studies show that a substrate having a film texture with the (200) crystal plane 22 parallel to the surface plane 15 of the chromium underlayer film 14 induces the growth of a cobalt-alloy recording layer film 16 having a film texture with the (1120) crystal plane 42 of FIG. 3C parallel to the surface plane 17 of recording layer 16. With the (1120) plane 42 parallel to the film surface plane 17, the texture of the recording layer 16 is in-plane anisotropic which is suitable for use in longitudinal recording media.

Selecting the collimating parameters to deposit a chromium layer with the (110) plane 24 oriented parallel the surface plane 15 of the underlayer film 14 yields a different sputter deposited cobalt-alloy recording layer film 16. Diffraction studies have shown that an underlayer crystal texture with the (110) plane 24 parallel to the film surface plane 15 induces growth of a sputtered cobalt-alloy layer having the (0002) plane 36 parallel the recording layer film plane 17. As seen in FIG. 3A, such a crystal texture, in turn, orients the (0110) plane 38 perpendicular to the film plane 17 with the magnetic easy axes of the crystal structures also perpendicular the film surface plane 17 as desired for perpendicular recording media. Therefore, selectively controlling the plane orientations of the crystal structures and the crystal texture of the underlayer by selective collimation achieves selective control of the recording properties of the magnetic recording layer 16.

Selectively collimating the sputter particles 44 during deposition of the underlayer 14 to produce a selected underlayer crystal texture may be sufficient to subsequently deposit the cobalt-alloy recording layer 16 with the desired crystal texture. However, it may be necessary to also selectively collimate the sputter particles during sputter deposition of the cobalt-alloy recording layer. Accordingly, the principles of the present invention may be utilized to also sputter deposit the magnetic recording layer film 16 through a collimator 46 to further select the crystal structure of the recording layer 16. That is, the collimator 46 of the present invention might be used to sputter deposit either the underlayer 14 or magnetic recording layer 16 individually or both the underlayer 14 and the recording layer 16 in succession.

The sputter deposition of a chromium underlayer and a cobalt-alloy recording layer is used as an example to illustrate the present invention because such an underlayer/recording layer composition is prevalent in magnetic recording media. However, it should be understood that the present invention will also be useful with other chemicals to achieve similar results. Additionally, the process of the present invention may be utilized to deposit magnetic recording layers for recording media other than magnetic recording media. For example, magneto-optical recording utilizes magnetic recording layers of rare earth metals and transition metals. For example, an alloy of a rare earth metal, e.g. terbium, and a transition metal, e.g., iron and/or cobalt might be utilized. When sputtering on a layer film of a rare earth/transition metal alloy, low angle sputter particles are produced which result in non-uniform magnetic properties of the deposited film. The collimating device with a selected aspect ratio will inhibit low angle sputtering to achieve more uniform magnetic properties in the magneto-optic recording layer film.

The objectives of the present invention may be further illustrated by several possible examples of collimated sputter deposition according to the features of the present invention. Specifically, varying particular collimating parameters as discussed hereinbelow should result in formation of magnetic recording layers on a recording media substrate which are useful for longitudinal and/or perpendicular recording. For example, a target 43 of chromium underlayer material may be sputtered onto substrate 49 inside of a sputter deposition chamber 41 which is evacuated from $1 \times 10^{-3}$ to $5 \times 10^{-2}$ Torr, using a plasma of Ar while maintaining the temperature of substrate 49 between 100° C. and 300° C. Using a collimator 46 having openings 48 with aspect ratios (i.e., t/d) approximately 0.5 or above should yield an underlayer film 14 having a crystal texture which generally promotes the deposition of a magnetic recording layer 16 with crystal structures oriented generally parallel the surface plane 17 of the layer. Such a magnetic recording layer 16 will generally be useful for longitudinal recording. Alternatively, maintaining other deposition parameters essentially constant and decreasing the aspect ratios of the collimator openings 48 below approximately 0.5 should result in an underlayer crystal texture which generally promotes the deposition of recording layer crystals oriented generally perpendicular the recording layer surface plane 17 for use in perpendicular recording.

Additionally, retaining essentially constant deposition parameters, the distance between collimator 46 and target 43, $D_1$, might be increased or decreased. Increasing $D_1$ should result in deposition of underlayer film 14 having a crystal texture which generally promotes a magnetic recording layer 16 with crystal structures oriented generally parallel the surface plane 17 for longitudinal recording. Again, with all other deposition parameters essentially constant, decreasing $D_1$ should yield an underlayer texture which generally promotes deposition of recording layer crystals oriented generally perpendicular plane 17 for perpendicular recording.

Still further, increasing or decreasing the distance $D_2$ between collimator 46 and substrate 42 might be used to affect the crystal texture of recording layer 16. Specifically, increasing $D_2$ should promote an underlayer crystal texture which should generally promote a recording layer 16 having crystals oriented generally parallel the plane 17 for longitudinal recording. Decreasing $D_2$ should yield an underlayer crystal texture which should generally promote a recording layer crystal orientation generally perpendicular surface plane 17 for perpendicular recording.

If a collimator 46 is utilized to sputter deposit the magnetic recording layer 16 according to another feature of the present invention, a collimator 46 with openings 50 having aspect ratios of approximately 0.5 and above should promote generally parallel recording layer crystal structures with respect to plane 17, while decreasing the aspect ratios of the openings 50 below approximately 0.5 should yield crystal structures oriented generally perpendicular the surface plane 17. Similarly, increasing $D_1$ should yield generally parallel recording layer crystal structures and decreasing $D_1$ should yield generally perpendicular recording layer crystal structures with respect to surface plane 17. Finally, increasing $D_2$ should yield generally perpendicular recording layer crystal structures and decreasing $D_2$ should yield generally parallel recording layer crystal structures with respect to surface plane 17.

While the present invention has been illustrated by the description of embodiments thereof, and while the embodiments have been described with respect to particular layer chemicals, it is not the intention of Applicant to restrict or in any way limit the scope of the appended claims to such detail. Additional advantages and modifications will readily appear to those skilled in the art. For example, magnetic recording media with an underlayer other than chromium or a recording layer other than a cobalt-alloy might be fabricated with the method of the present invention. The invention in its broader aspects is therefore not limited to the specific details, representative apparatus and method, and illustrative example shown and described. Accordingly, departures may be made from such details without departing from the spirit or scope of the general inventive concept.

What is claimed is:

1. A method of selectively choosing the magnetic properties of a sputter deposited recording layer of a non-tape recording medium comprising:

providing a substrate and a target of metal underlayer material facing the substrate and spaced from the substrate inside a sputter deposition chamber, the underlayer material having crystal structures with a variety of different, selectable crystal orientations;

sputtering the target into a plurality of sputter particles, the sputter particles striking the substrate to deposit a film of metal underlayer material upon the substrate;

maintaining the substrate generally stationary with respect to the target;

selectively collimating the sputter particles to vary the arrival energy and angular distribution of the sputter particles striking the generally stationary substrate to selectively establish the orientation of the crystals of the metal underlayer film deposited on the substrate;

collimating with a collimating structure having a plurality of collimating apertures with widths, depths and associated aspect ratios and selectively varying the aspect ratios of the collimating apertures to selectively establish the orientation of the crystals in the metal underlayer film;

sputter depositing a magnetic metal film over the metal underlayer film to form a magnetic recording layer, the magnetic metal film having a different metallic composition than the underlayer film and comprising crystals whose orientations are affected by the crystal orientation of the crystals in the underlayer film such that the deposited magnetic metal film has a crystal texture dependent upon the crystal texture of the underlayer film;

whereby the magnetic properties of the magnetic recording layer are chosen by selectively collimating while sputter depositing the underlayer material.

2. The method of claim 1 further comprising selectively varying the aspect ratios by varying the widths of the apertures.

3. The method of claim 1 further comprising selectively varying the aspect ratios by varying the depths of the apertures.

4. The method of claim 1 further comprising selectively varying the distance between the collimating structure and the target of underlayer material to selectively establish the orientation of the crystals in the metal underlayer film.

5. The method of claim 1 further comprising selectively varying the distance between the collimating structure and the substrate to selectively establish the orientation of the crystals in the metal underlayer film.

6. The method of claim 1 further comprising selectively collimating to establish an underlayer film with a crystal texture which produces deposition of a magnetic metal film with crystal structures having magnetic easy axes predominantly in a direction parallel to a surface plane of the magnetic metal film whereby the recording medium may be used for longitudinal recording.

7. The method of claim 1 further comprising selectively collimating to establish an underlayer film with a crystal texture which produces deposition of a magnetic metal film with crystal structures having magnetic easy axes predominantly in a direction normal to a surface plane of the magnetic metal film whereby the recording medium may be used for perpendicular recording.

8. The method of claim 1, wherein the metal underlayer material contains one of chromium, vanadium and tungsten.

9. The method of claim 1, wherein the metal magnetic film contains cobalt.

10. The method of claim 1, wherein the metal magnetic film contains a rare-earth metal and a transition metal.

11. A method of selectively choosing the magnetic properties of a sputter deposited recording layer of a non-tape recording medium comprising:

providing a substrate and a first target of metal underlayer materials facing the substrate and spaced from the substrate inside a sputter deposition chamber, the underlayer material having crystal structures with a variety of different, selectable crystal orientations;

sputtering the target into a plurality of sputter particles, the sputter particles striking the substrate to deposit a film of metal underlayer material upon the substrate;

maintaining the substrate generally stationary with respect to the first target;

selectively collimating the sputter particles to vary the arrival energy and angular distribution of the sputter particles striking the generally stationary substrate to selectively establish the orientation of the crystals of the metal underlayer film deposited on the substrate;

collimating with a collimating structure having a plurality of collimating apertures with widths, depths and associated aspect ratios and selectively varying the aspect ratios of the collimating apertures to selectively establish the orientation of the crystals in the metal underlayer film;

providing a second target of a magnetic metal material spaced from the substrate, the magnetic metal material having a different metallic composition than the underlayer metal and having crystal structures with a variety of different, selectable crystal orientations;

sputtering the magnetic metal second target into a plurality of sputter particles, the sputter particles striking the substrate to deposit a magnetic metal film over the underlayer film, the magnetic metal film having crystals with an orientation which is affected by the orientation of the crystals in the underlayer film such that the deposited magnetic metal film has a crystal texture dependent upon the crystal texture of the underlayer film; and selectively collimating the sputter particles of magnetic metal material to vary the arrival energy and angular distribution of the magnetic metal sputter to further affect the orientation of the crystals in the magnetic metal film;

whereby the magnetic properties of the magnetic recording layer are chosen by selectively collimating while sputter depositing both the underlayer material and the magnetic metal recording layer material.

12. The method of claim 11 further comprising selectively varying the aspect ratios by varying the widths of the apertures.

13. The method of claim 11 further comprising selectively varying the aspect ratios by varying the depths of the apertures.

14. The method of claim 11 further comprising selectively collimating the magnetic metal material to deposit a magnetic recording layer with crystal structures having magnetic easy axes predominantly in a direction parallel to a surface plane of the magnetic metal film whereby the recording medium may be used for longitudinal recording.

15. The method of claim 11 further comprising selectively collimating the magnetic metal material to deposit a magnetic recording layer with crystal structures having magnetic easy axes predominantly in a direction normal to a surface plane of the magnetic metal film whereby the recording medium may be used for perpendicular recording.

* * * * *

UNITED STATES PATENT AND TRADEMARK OFFICE
CERTIFICATE OF CORRECTION

PATENT NO. : 5,616,218
DATED : April 1, 1997
INVENTOR(S) : Michael Alex

It is certified that error appears in the above-indentified patent and that said Letters Patent is hereby corrected as shown below:

In column 5, line 59, delete "(0110)" and insert --(01_10)--.

In column 5, line 61, delete "(0111)" and insert --(01_11)--.

In column 5, line 62, delete "(1120)" and insert --(11_20)--.

In column 6, line 3 (two instances), delete "(0110)" and "(1120)" and insert --01_10-- and --11_20)--, respectively.

In column 6, line 6, delete "(0110)" and insert --(01_10)--.

In column 6, line 7, delete "(1120)" and insert --(11_20)--.

In column 6, line 23, delete "(0111)" and insert --(01_11)--.

In column 8, line 35, delete "(1120)" and insert --(11_20)--.

In column 8 line 37, delete "(1120)" and insert --(11_20)--.

UNITED STATES PATENT AND TRADEMARK OFFICE
CERTIFICATE OF CORRECTION

PATENT NO. : 5,616,218

DATED : April 1, 1997

INVENTOR(S) : Michael Alex

It is certified that error appears in the above-indentified patent and that said Letters Patent is hereby corrected as shown below:

In column 8, line 50, delete "(0110)" and insert --(01<u>1</u>0)--.

Signed and Sealed this

Twenty-eighth Day of October, 1997

Attest:

BRUCE LEHMAN

Attesting Officer     Commissioner of Patents and Trademarks